(12) United States Patent
Moslehi

(10) Patent No.: US 6,200,871 B1
(45) Date of Patent: Mar. 13, 2001

(54) HIGH PERFORMANCE SELF-ALIGNED SILICIDE PROCESS FOR SUB-HALF-MICRON SEMICONDUCTOR TECHNOLOGIES

(75) Inventor: Mehrdad M. Moslehi, Los Altos, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/298,018

(22) Filed: Aug. 30, 1994

(51) Int. Cl.$^7$ .................................................. H01L 21/336
(52) U.S. Cl. .................... 438/303; 438/586; 438/655; 438/683
(58) Field of Search ....................... 437/41, 200, 44, 437/41 GS, 41 SM; 748/DIG. 19, DIG. 147; 438/301, 303, 586, 655, 683

(56) References Cited

U.S. PATENT DOCUMENTS

| | | | |
|---|---|---|---|
| 4,877,755 | * 10/1989 | Rodder | 437/200 |
| 4,885,259 | * 12/1989 | Osinski et al. | 437/41 |
| 4,920,071 | * 4/1990 | Thomas | 437/188 |
| 4,933,295 | * 6/1990 | Feist | 437/33 |
| 5,070,038 | * 12/1991 | Jin | 437/200 |
| 5,084,417 | * 1/1992 | Joshi et al. | 437/192 |
| 5,130,266 | * 7/1992 | Huang et al. | 437/44 |
| 5,352,631 | * 10/1994 | Sitaram et al. | 437/200 |

\* cited by examiner

Primary Examiner—T. N. Quach
(74) Attorney, Agent, or Firm—Wade James Brady III; Frederick J. Telecky, Jr.

(57) ABSTRACT

One instant invention is a method for fabricating a semiconductor device with a self-aligned silicide region, the method comprising: providing a semiconductor substrate (26) of a first conductivity type, the semiconductor substrate has a surface; forming field insulating regions (12) at the surface of the semiconductor substrate; forming a gate structure (10) insulatively disposed over the substrate and situated between the field insulating regions, the gate structure including a gate electrode; forming source/drain junction regions (14) of a second conductivity type opposite the first conductivity type, the source/drain junction regions are formed in the substrate adjacent to the gate structure and extending from the gate structure to the field insulating regions; a channel region (22) disposed between the source/drain regions beneath the gate structure in the substrate; a self-aligned silicide region (16) formed on the source/drain junction regions, the silicide formed by depositing a layer of metal (preferably titanium), performing a react process and removing any unreacted metal; and forming separate electrically conductive regions (36) (preferably comprised of CVD-WSi$_x$, where x is between 2 and 3) using a nonselective conductive layer deposition process, each contacting one of the source/drain regions, and simultaneously forming another electrically conductive region (34) from the same conductive material on the gate structure.

5 Claims, 4 Drawing Sheets

HIGH PERFORMANCE SELF-ALIGNED SILICIDE PROCESS FOR SUB-HALF-MICRON SEMICONDUCTOR TECHNOLOGIES

FIELD OF THE INVENTION

The instant invention relates to microelectronic technology and semiconductor processing, and, more specifically, to a method of fabricating a semiconductor device with self-aligned silicide regions for integrated circuits.

BACKGROUND OF THE INVENTION

Some high performance semiconductor technologies (such as complementary metal-oxide-semiconductor, CMOS, technologies used for high performance microprocessors and SRAM devices) employ self-aligned silicide regions ("salicide") to reduce source/drain junction and gate parasitic resistance elements. As semiconductor technologies scale to the sub-half-micron minimum feature size regime, junction leakage requirements place a serious constraint on the maximum initial refractory metal (for example, titanium or cobalt) thickness. This is due to the requirement that the amount of silicon consumption over the source/drain junction regions must be reduced in order to prevent junction leakage problems. This will, however, increase the silicide sheet resistance and reduce the benefit of the salicide formation due to increased parasitic source/drain and gate resistance elements.

Several approaches have been proposed in order to overcome the above-mentioned limitations and produce low sheet resistance salicide for sub-half-micron insulated-gate field-effect transitor (IGFET) devices. One method is based on the use of elevated source/drain junction structures to allow thicker silicide but electrically shallow junctions. This method is, however, undesirable due to its need for selective silicon growth which results in added process complexity (due to the deposition selectivity requirement) and cost. Thus, there has been a preference to avoid elevated source/drain junction structures in IC manufacturing.

Recently, another method has been proposed to lower the source/drain junction and gate sheet resistance values. This method is based on the combination of self-aligned silicide and selective chemical-vapor deposited tungsten ("CVD-W") processes. This method employs a relatively thin layer of initial refractory metal layer (for example the titanium layer would be less than 500 Å thick) to form a salicide structure without excessive silicon consumption. The salicide process is then followed by selective chemical-vapor deposition of tungsten ("CVD-W") to further reduce the source/drain junction and gate sheet resistance values due to the CVD-W/TiSi$_2$ stack structure over these regions. This method, however, has some drawbacks. First, it requires a selective CVD-W process which makes it a rather complex and expensive process (due to the strict deposition process selectivity requirement). Second, the CVD-W to TiSi$_2$ contact resistance can become rather high due to the action of fluorine during the CVD-W process, which can result in the formation of a nonvolatile insulating TiF$_x$ compound at the CVD-W/TiSi$_2$ interface. Selective CVD-W processes usually employ a process medium consisting of WF$_6$, SiH$_4$, and H$_2$. Tungsten is selectively deposited (typically at a substrate termperature of 300° C.) on the regions with exposed silicon and/or metallic coating. The TiF$_x$ formation process may occur due to presence of fluorine caused by WF$_6$. Third, this method may introduce the formation of wormholes in silicon due to CVD-W, which can result in excessive junction leakage. Thus, it is desirable to employ a process which can produce low sheet resistance salicide without a need for selective CVD-W.

SUMMARY OF THE INVENTION

This invention provides a fully self-aligned processing technique for fabrication of sub-half-micron salicided devices (including IGFETs) with very small, on the order of less than 300 Å, silicon consumption and very low source/drain junction and gate sheet resistance values. An embodiment of the present invention is a method which does not require any selective deposition processes and employs standard silicon processing resources. The method of the present invention also provides a silicide local interconnect as a byproduct of the fabrication process flow.

One embodiment of the instant invention is a method for fabricating a semiconductor device with a self-aligned silicide region, the method comprising: providing a semiconductor substrate of a first conductivity type, the semiconductor substrate has a surface; forming field insulating regions at the surface of the semiconductor substrate; forming a gate structure insulatively disposed over the substrate and situated between the field insulating regions, the gate structure including a gate electrode; forming source/drain junction regions of a second conductivity type opposite the first conductivity type, the source/drain junction regions are formed in the substrate adjacent to the gate structure and extending from the gate structure to the field insulating regions; a channel region disposed between the source/drain regions beneath the gate structure in the substrate; a self-aligned silicide region formed on the source/drain junction regions, the silicide formed by depositing a layer of metal (preferably titanium), performing a react process and removing any unreacted metal; and forming separate electrically conductive regions (preferably comprised of CVD-WSi$_x$, where x is between 2 and 3) using a nonselective conductive layer deposition process, each contacting one of the source/drain regions, and simultaneously forming another electrically conductive region from the same conductive material on the gate structure.

Another embodiment of the instant invention is a method for fabricating a semiconductor device with a self-aligned silicide region, the method comprising: providing a semiconductor substrate of a first conductivity type, the semiconductor substrate has a surface; forming field insulating regions at the surface of the semiconductor substrate; forming a gate structure insulatively disposed over the substrate and between the field insulating regions, the gate structure having a top surface and a side surface and including a gate electrode; forming a disposable structure (preferably comprising silicon nitride) overlying the gate structure, the disposable structure having a top surface and a side surface; forming side wall insulators adjacent to the gate structure and the disposable structure and extending along side surfaces of the gate structure and the disposable structure; forming source/drain junction regions of a second conductivity type opposite the first conductivity type, the source/drain junction regions formed in the substrate adjacent to the gate structure and extending from the gate structure to the field insulating regions; providing a channel region disposed between the source/drain junction regions beneath the gate structure in the substrate; selectively removing the disposable structure; providing a silicide region formed on the source/drain junction regions, the silicide formed by depositing a layer of metal (preferably comprising titanium), performing a react process and removing any unreacted metal and metal composites; forming separate electrically conductive regions by means of a nonselective conductive material layer deposition process, each contacting one of the source/drain junction regions, and simultaneously forming an electrically conductive region from the same conductive material (preferably comprised of CVD-WSi$_x$, where the value of x is in between 2 and 3) on the gate structure (preferably the conductive region on the gate structure is substantially the same thickness as the disposable structure); and wherein the conductive region formed on the gate structure is located in substantially the same location as the disposable structure. In one alternative embodiment the silicide region is formed after the disposable layer is removed thereby forming the silicide layer on the gate structure and between the gate structure and the conductive region on the gate structure. In another embodiment the silicide region is formed before the disposable layer is removed thereby providing the silicide region only on the source/drain junction regions.

BRIEF DESCRIPTION OF THE DRAWINGS

FIGS. 1–3 illustrate the fabrication of one embodiment of the present invention. FIGS. 4 and 5 illustrate another embodiment.

DETAILED DESCRIPTION OF THE PRESENT INVENTION

The process flow of the present invention is shown with respect to an NMOS device. However, PMOS devices can be simultaneously fabricated using the process flow of the instant invention. In addition, the process flow illustrated by the devices of FIGS. 1–5 is for non-LDD (i.e. a device not having lightly doped source/drain junction regions) devices. Devices having LDD's, however, can also be fabricated using the process flow of the instant invention for the salicide process. Moreover, the process flows of this invention can also be used for fabricaion of self-aligned bipolar junction transistor.

Figure 1:
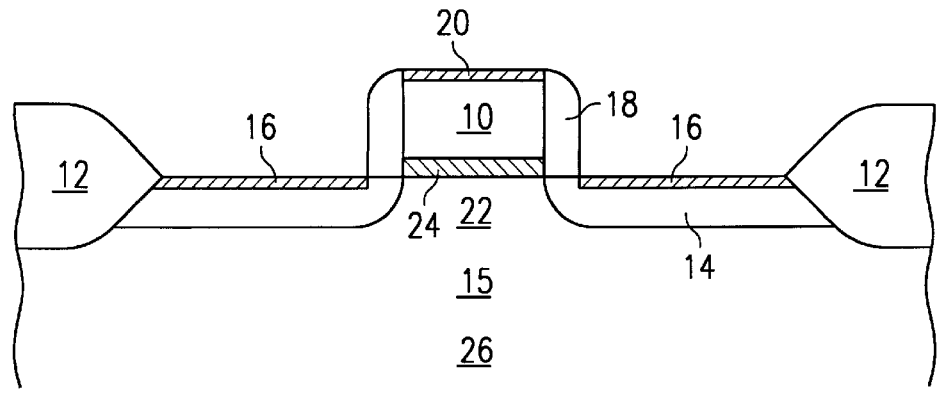
FIGS. 1, 2, 3, 4, and 5 are cross sectional views of two embodiments of the present invention.

Referring to FIG. 1, after a semiconductor wafer is provided, a semiconductor layer (preferably a doped epitaxial silicon layer) may be deposited on the semiconductor wafer resulting in a substrate with a lightly doped epitaxial layer on a heavily doped region. The semiconductor wafer/semiconductor layer is illustrated as region 26 and will generically be called "semiconductor layer 26" throughout the specification. Semiconductor layer 26 may either be in situ doped at deposition, subsequently doped or any other standard method of doping a semiconductor wafer or semiconductor layer. For the NMOS device illustrated in FIGS. 1–5, semiconductor layer 26 is doped with a p-type dopant, such as in a CMOS p-well region. After semiconductor layer 26 is formed, alignment marks (not shown) are etched into semiconductor layer 26. The alignment marks may be etched into the semiconductor wafer and an epitaxial layer may be formed over the semiconductor layer or they may be etched in the doped epitaxial layer. In either case, the alignment marks will still be visible for subsequent microlithography alignment purposes. CMOS well regions 15 are formed, next, using the alignment marks for exact positioning of the n-well and p-well regions. For an NMOS device, well regions 15 are doped with a p-type dopant, such as boron, in order to create what is commonly referred to as p-well regions. Next, field oxide regions 12 are formed using a process such as local oxidation of silicon (LOCOS). Field oxide regions 12 are aligned with respect to the microlithography alignment marks. After field oxides 12 are formed, a thin layer of insulating material, preferably silicon dioxide, is formed by a process such as thermal oxidation. Next a layer of conducting material is deposited, preferably polysilicon, over the insulating layer to be used as the CMOS gate electrode. The conducting layer is then patterned and etched so as to form transistor gate region 10 over gate dielectric layer 24. Next, side wall spacer regions 18 are formed by depositing a conformal layer of dielectric material and anisotropically etching that material using an anisotropic reactive ion etch process.

Heavily doped source/drain junction regions 14 are formed by an ion implantation process followed by a thermal anneal process. This results in the formation of n+source/drain junctions for NMOS transistors. A separate ion implantation step is used to form the p+source/drain junctions for PMOS transistors.

The next process step is to deposit a thin layer (preferably on the order of 200 Å thick) of refractory metal (preferably titanium) using a suitable deposition process such as physical-vapor deposition (PVD). After the refractory metal is deposited then a silicide react process is preformed. For instance, a titanium silicide react process may be performed in a rapid thermal processing (RTP) reactor in a nitrogen ambient at 650° to 700° C. This is followed by a selective etch process which will selectively remove all unreacted refractory metal and/or metal nitride (such as titanium nitride). The only remaining refractory metal material regions on the transistor source/drain junction and gate regions are refractory metal silicide regions 16 and 20, respectively.

Figure 2:
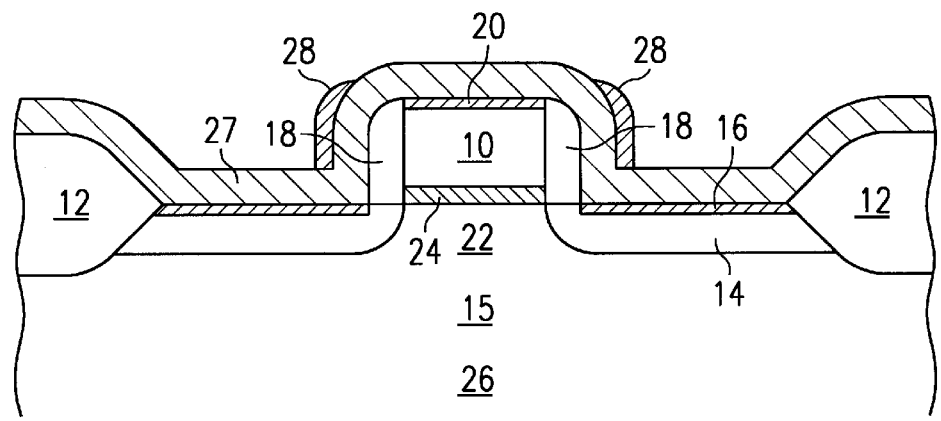

Now referring to FIG. 2, after salicided regions 16 and 20 are formed, layer 27 (preferably WSi$_x$) is deposited (preferably by a low temperature, less then 400° C., SiH$_4$/H$_2$/WF$_6$ based CVD process). Preferably, commercially available equipment will be used to deposit the WSi$_x$ layer with an X value in the range of 2.0 to 2.7. This can be accomplished by using a process which deposits a bilayer of WSi$_x$, where the X-value is near the stoichiometric value of 2 for most of the layer and between the values of 2.4 and 2.7 for a thin portion (on the order of 50–100 Å) of the layer near the top. It is also possible to use a constant X-value throughout the entire WSi$_x$ layer. The total WSi$_x$ layer thickness may be on the order of 500 to 1500 Å. The graded stoichiometry is a preference and not a requirement. It can be easily handled by commercial CVD-WSi$_x$ equipment The CVD-WSi$_x$ deposition process parameters may be selected to promote a nonconformal deposition process (i.e. thinner WSi$_x$ layer on the sidewalls).

Next, a thin (preferably on the order of 100 to 300 Å) conformal layer of insulating material, preferably a silicon nitride oxidation mask layer, is deposited using low-pressure chemical-vapor deposition (LPCVD). If LPCVD is used, then the LPCVD silicon nitride process temperature (preferably around 800°–850° C.) also acts as an anneal process for resistivity reduction of both the refractory metal salicide (preferably TiSi$_2$) regions 16 and 20 and conductive layer 27 (preferably CVD-WSi$_x$). Then, a short anisotropic silicon nitride etch is performed using layer 27 as an etch stop layer. This anisotropic nitride etch process may be performed in a high-density plasma source such as an inductively coupled plasma (ICP) reactor. The result of this is the formation of thin insulating filament spacers 28 which mask the portions of layer 27 which are alongside gate sidewall spacers 18. Preferably, thin insulating filament spacers 28 are formed of silicon nitride due to its excellent oxidation mask characteristics.

Figure 3:
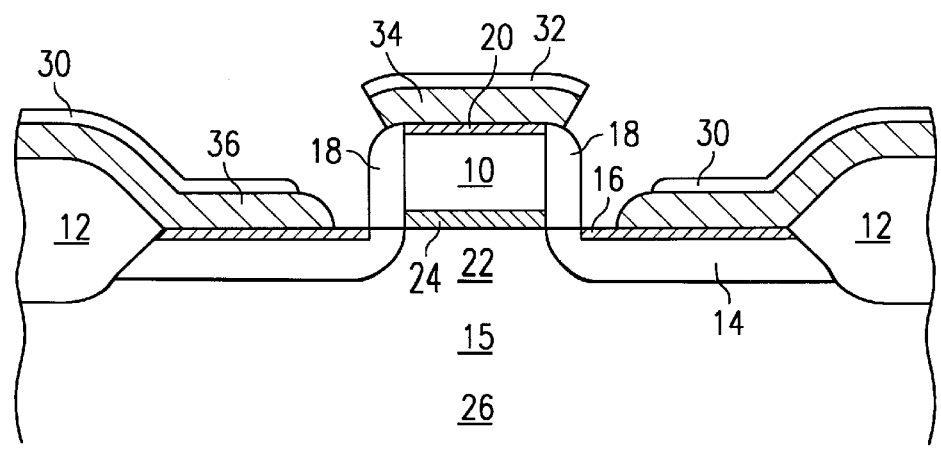

Referring to FIG. 3, a short low-temperature (preferably on the order of 750° C. to 850° C.) thermal oxidation is performed so as to grow a thin (approximately 50 to 100 Å) $SiO_2$ layer over exposed regions of layer 27. The portion of layer 27 over the gate sidewall is not oxidized due to the oxidation masking effect of thin silicon nitride spacers 28. Next, thin silicon nitride spacers 28 are stripped using a selective isotropic etch (plasma or wet) which etches only thin silicon nitride spacers 28 and nothing else. Then a timed selective etch (such as an isotropic $SF_6$ plasma etch) is performed to remove the portion of layer 27 (preferably a CVD $WSi_x$ layer) which lies along gate sidewalls spacer regions 18. Note that the portion of layer 27 over the gate, source/drain and field oxide regions is protected by the thin (preferably on the order of 50–100 Å) grown oxide cap (referred to as 32 and 30, respectively). Note also that the portion of layer 27 that overlies gate 10 is referred to as region 34 and the portion of layer 27 that overlies source/drain junctions regions 14 and field oxide regions 12 is referred to as region 36. Moreover, any overetch during the removal of the portions of layer 27 that were situated alongside sidewall spacer regions 18 does not etch silicon from source/drain junction regions 14 and gate region 10 since these regions are fully sealed by thin refractory metal silicide layers 16 and 20 (preferably $TiSi_2$), respectively. In addition, the use of a thin Si-rich $WSi_x$ ($x \approx 2.4$–2.7) region over layer 27 ensures acceptable $SiO_2$ growth during the short low-temperature CVD-$WSi_x$ thermal oxidation process.

Figure 6:
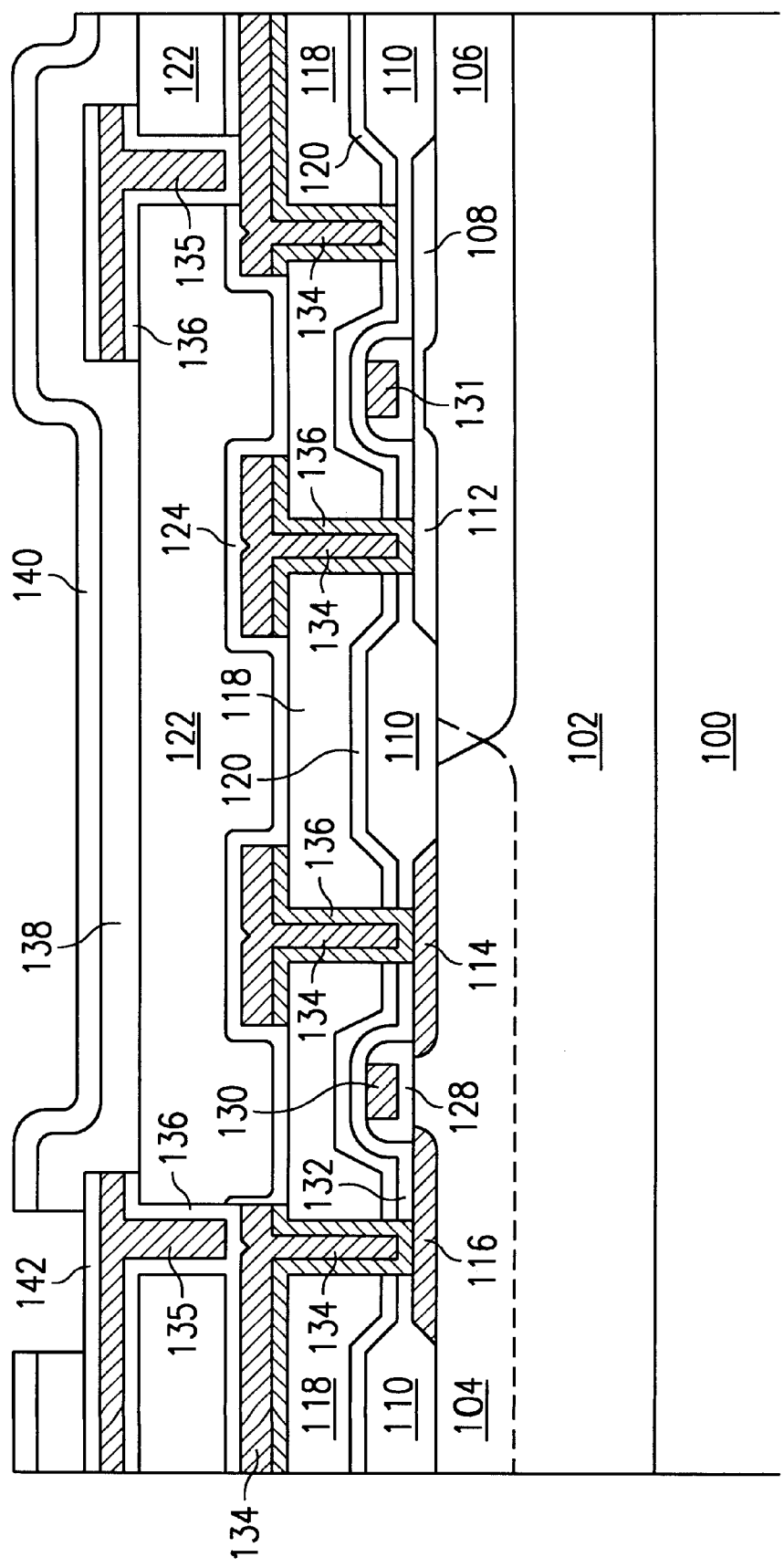
FIG. 6 is a cross sectional view of of a CMOS device structure which can utilize the embodiments of this invention.

The following steps are not illustrated in FIGS. 1–4, but can be implemented in a CMOS device structure such as the one depicted in FIG. 6. Next, a local interconnect mask is utilized to form the CVD-$WSi_x$ local interconnects by a lithography and CVD-$WSi_x$ etch steps. This is a major advantage over the conventional TiN local interconnect technology. The CVD-$WSi_x$ local interconnect is a free byproduct of this invention. CVD-$WSi_x$ local interconnects can be easily patterned by relatively environmentally safe plasma chemistries such as $SF_6$ plasma. Next, the subsequent device fabrication process steps are performed so as to form the device contacts and multilevel interconnect structures. An important feature of the technology proposed by this invention is that the CVD-$WSi_x$ layer over the source/drain junction and gate regions also serves as an excellent etch-stop layer during the subsequent contact etch process. This prevents any junction silicon overetch or junction damage. This is a very important feature for enhancing manufacturing yield. Therefore, the contact etch process can use excessive (on the order of 50–100%) overetch without causing any junction leakage or device reliability problems due to the effective CVD-$WSi_x$ etch stop region over the $TiSi_2$-sealed junctions. Moreover, the CVD-$WSi_x$ junction straps may also eliminate the need for collimated Ti sputter deposition after contact etch.

The process flow of the present invention allows formation of CVD-$WSi_x$ steps with thicknesses as large as 1000 to 1500 Å for typical polysilicon gate heights of 3000 to 4000 Å. If the ultimate polysilicon gate thickness is less than 3000 Å (for example, 2500 Å for 0.25–0.35 μm technologies) and/or if a thicker CVD-$WSi_x$ strap is desired over the source/drain junctions and the gate structure (e.g., greater than 1500 Å CVD-$WSi_x$), then the process flow illustrated in FIGS. 4 and 5 should be used.

Figure 4:
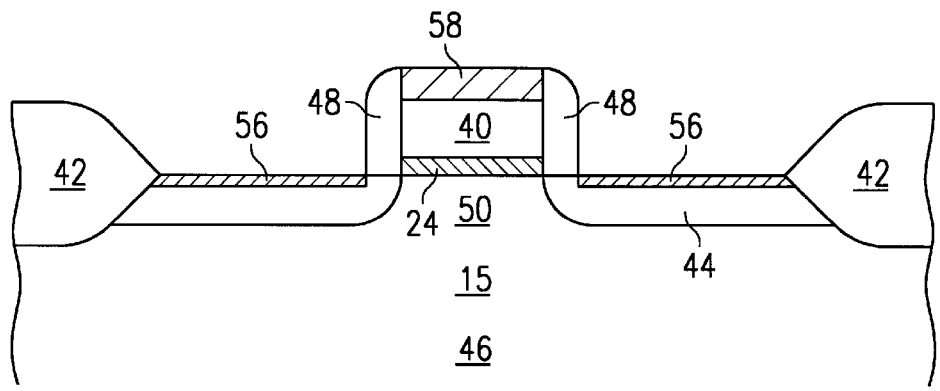
Figure 5:
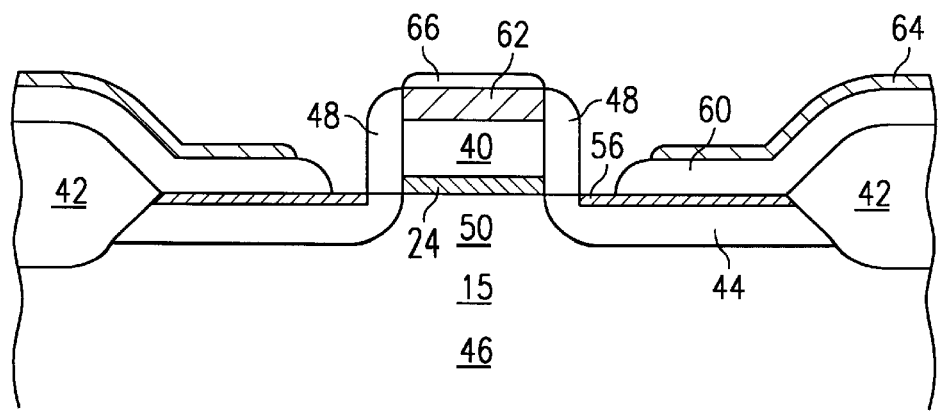

Referring to FIGS. 4 and 5, the process flow of this alternative embodiment of the present invention is identical to the process flow illustrated in FIG. 1 up to the point where the gate is formed. As in the process flow of FIG. 1, a conductive layer (not shown), preferably polysilicon, is deposited over the existing structures. Next a disposable layer, preferably silicon nitride, is deposited over the conducting layer. Then the conductive layer and the silicon nitride layer are anisotropically etched so as to form conductive gate structure 40 and patterned disposable layer 58, respectively. As in FIG. 2, sidewall dielectric spacers 48 and silicide regions 56 are formed, and excess refractory metal and/or metal nitride is removed. This results in the formation of silicided regions 56 over source/drain junctions 44. Due to the presence of disposable silicon nitride layer 58, no silicide is formed on gate electrode polysilicon region 40. After sidewall spacers 48 and silicide regions 56 are formed, disposable silicon nitride layer 58 is selectively removed, preferably by a plasma etch (or wet etch) process.

Figure 4A:
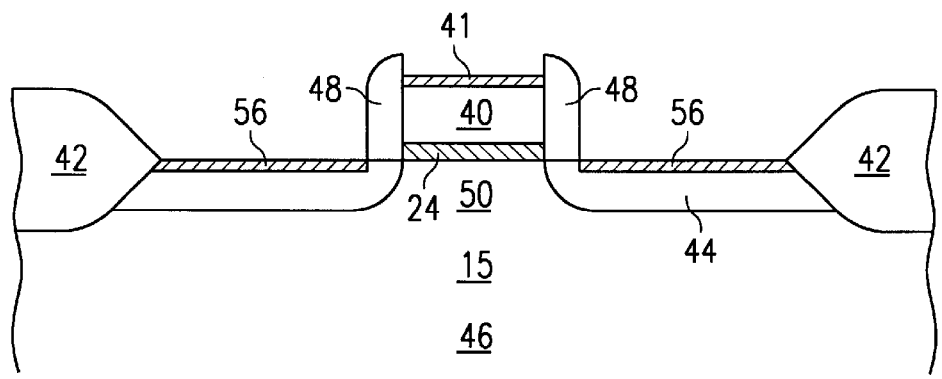
FIG. 4a illustrates a third embodiment.

In this alternative embodiment the self-aligned silicide regions can be performed either before or after removal of the disposable silicon nitride layer 58. The result of forming the silicided regions before the removal of silicon nitride layer 58 is depicted in FIG. 4. Whereas, the result of forming the silicided regions after the removal of silicon nitride layer 58 is depicted in FIG. 4*a*. The main difference between these two devices is the presence of silicided region 41 on conductive gate structure 40 and the absence of silicon nitride layer 58 in FIG. 4*a*. Despite these differences, the device of FIG. 4*a* will look like the device of FIG. 5 (with additional processing) except for the presence of silicide region 41 between conductive gate structure 40 and conductive region 62.

Referring to FIG. 5, as is illustrated in FIGS. 2 and 3, a conductive layer (such as CVD-$WSi_x$) is deposited, which fills the trench created by the removal of disposable silicon nitride layer 58 to form conductive region 62. Next, a thin oxidation mask layer is deposited (preferably silicon nitride). The thin oxidation mask layer is anisotropically etched leaving a region of the thin oxidation mask layer which covers the portion of the conductive layer (preferably CVD-$WSi_x$) that is situated along the sidewall spacer. Next, the wafer is subjected to an oxidizing atmosphere which grows a thermal oxide layer on the exposed regions of the conductive layer surface. Thus, an oxide is formed over the entire CVD-$WSi_x$ surface except on the sidewall regions where the CVD-$WSi_x$ oxidation is prevented due to the oxidation masking effect of the silicon nitride sidewall spacers. A selective etch is subsequently preformed. During this process step only the remaining sidewall silicon nitride spacers are etched and thereby a region of the conducting layer (preferably CVD-$WSi_x$), along the side wall spacer, is exposed. The exposed portion of the conducting layer is subsequently etched, using a selective etch process, and the remaining portions of the conducting layer are shown in FIG. 5 as regions 60 and 62. In addition, FIG. 5 illustrates the remaining portions of the oxide layer, which are designated as region 64 and 66. The remaining device favrication process flow proceeds using standard integrated circuit fabrication processes in order to form the local interconnect and multilevel interconnect structures.

FIG. 6 illustrates a schematic diagram of CMOS-type devices which can utilize the fabrication process of the present invention. While the devices of FIG. 6 refer to specific dopant types, it is possible to fabricate these devices using dopants of the opposite conductivity type while still utilizing the processing steps of the instant invention. Substrate 100 is fabricated using p-type dopants (preferably the substrate is heavily doped with boron), and epitaxial layer 102 is also p-type (preferably the epitaxial layer is lightly doped with boron). The CMOS p-well regions 104 and n-well regions 106 are formed in boron-doped epitaxial layer 102 using boron and phosphorus ion implantations, respectively, followed by a thermal anneal process. Regions 114 and 116 are n+source/drain junction regions and regions 108 and 112 are p+source/drain junction regions. Field oxide isolation regions 110 are formed between the devices; and sidewall spacer regions 128 are formed adjacent NMOS and PMOS transistor gate structures 130 and 131. TEOS oxide layer 120 is deposited over both devices, preferably by low-pressure chemical-vapor deposition (LPCVD). Overlying TEOS 120 is TEOS boro-phospho-silicate glass (BPSG) layer 118 which is preferably deposited by plasma-enhanced chemical-vapor deposition (PECVD) and is subsequently reflowed using thermal BPSG reflow techniques. In addition, second BPSG layer 122 is situated above the first BPSG layer 118 and after formaiton of the first patterned interconnect level.

Interconnects 134 and 135, which connect source/drain junction regions 108, 112, 114 and 116 as well as CMOS gates 130 and 131 to the other devices, are fabricated using CVD-W or reflowed aluminum. Regions 136, formed underneath interconnects 134 and 135, are Ti/TiN bilayers fabricated using collimated sputtering. Layers of PECVD TEOS oxide (i.e. regions 124 and 138) are formed over BPSG layers 118 and 122. The stacked layer of PECVD TEOS oxide 138 and PECVD silicon nitride layer 140 is formed as a protective overcoat. The fabrication process flows of this invention for formation of low-resistance source/drain junctions and CMOS gate electrodes can be easily integrated in any CMOS or BiCMOS technology including the aforementioned devices.

Figure 7:
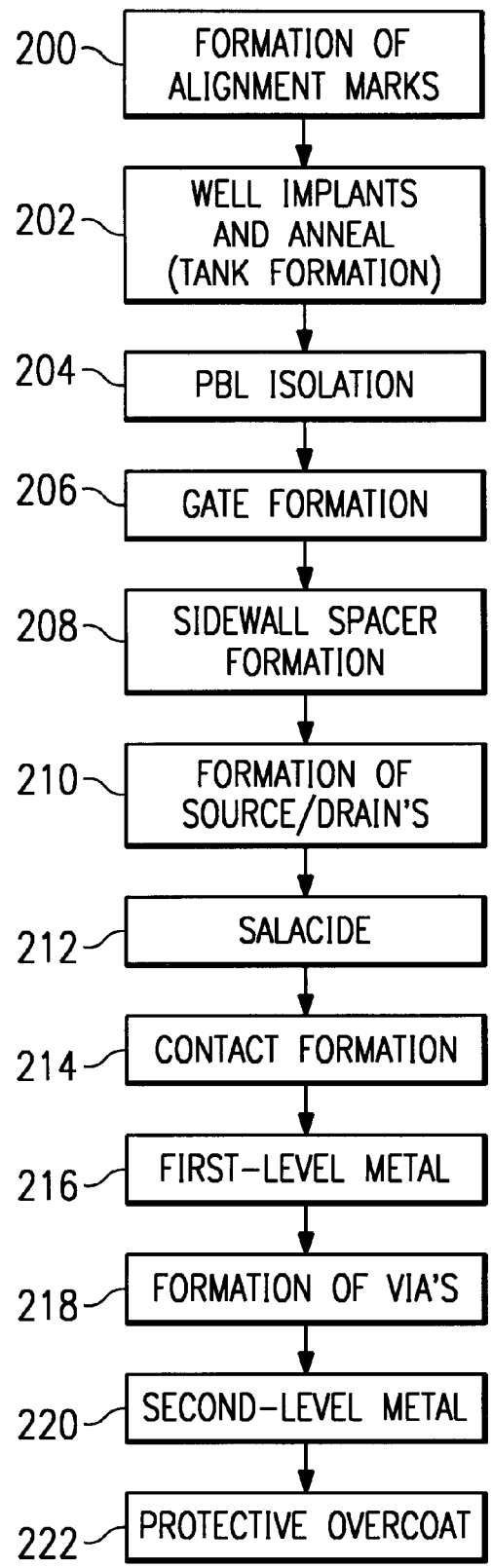
FIG. 7 illustrates a CMOS process flow which can incorporate an embodiment of the present invention for salicide formation.

FIG. 7 is an illustration of a process flow which can be used to fabricate a CMOS device such as the one depicted in FIG. 6. The process flow of FIG. 7 includes the process flow of the present invention (which is included in salicide process module 212). The first step in the process flow of FIG. 7 is the formation of alignment marks. This first step is illustrated by block 200, and includes a first mask and semiconductor etch. Second step 202 is the formation of CMOS well regions. Step 202 includes forming a thin oxide layer on the surface of the semiconductor layer (or substrate), performing masked well implants (boron and phosphorous for p-well and n-well regions, repectively), performing the CMOS well formation thermal anneal, and stripping the thin oxide layer. Next, step 204 is preformed to form PBL isolation. The poly-buffered LOCOS (PBL) isolation process module consists of forming a patterned stached structure of silicon nitride/polysilicon/silicon dioxide, performing a filed oxidation process, and removing the PBL oxidation mask stack. This results in the formation of patterned field oxide regions. Step 206 forms the patterned CMOS gate structure and step 208 forms the sidewall dielectric spacers which are adjacent to the CMOS gate structures. Subsequently, source/drain junction regions are formed in step 210. Step 210 includes formation of an implant screen oxide, patterned NMOS implants (preferably arsenic or phosphorous), patterned PMOS implants (preferably boron), and a rapid thermal anneal step to form the source/drain junction regions. After process module 210 is completed, salicide process module 212 is performed. Included in step 212 is the deposition of a refractory metal (preferably titanium), a rapid thermal silicide formation process, stripping away the unreacted titanium and titanium nitride, and a rapid thermal anneal of the silicided regions. The process steps of this invention are included in salicide process module 212. Next, contacts are formed in step 214. This is followed by the formation of the first-level metal (step 216), the formation of via's (step 218), the formation of the second-level metal (step 220) and the deposition of a protective overcoat (step 222).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed:

1. A method of fabricating a semiconductor device with a self-aligned silicide region, said method comprising:

providing a semiconductor substrate of a first conductivity type, said semiconductor substrate has a surface;

forming field insulating regions at said surface of said semiconductor substrate;

forming a gate structure insulatively disposed over said substrate and between said field insulating regions, said gate structure having a top surface and a side surface and including a gate electrode;

forming a disposable structure overlying said gate structure, said disposable structure having a top surface and a side surface;

forming side wall insulators adjacent to said gate structure and said disposable structure and extending along side surfaces of said gate structure and said disposable structure;

forming source/drain junction regions of a second conductivity type opposite said first conductivity type, said source/drain junction regions formed in said substrate adjacent to said gate structure and extending from said gate structure to said field insulating regions;

providing a channel region disposed between said source/drain junction regions beneath said gate structure in said substrate;

selectively removing said disposable structure;

providing a silicide region formed after said disposable layer is removed thereby forming said silicide layer on said gate structure and on said source/drain junction regions, said silicide formed by depositing a layer of metal, performing a react process and removing any unreacted metal and metal composites;

forming separate electrically conductive regions by means of a nonselective conductive material layer deposition process, each contacting one of said source/drain junction regions, and simultaneously forming an electrically conductive region from the same conductive material on said silicide region formed on said gate structure;

and wherein said silicide region formed on said gate structure is formed between said gate structure and said conductive region, and said conductive region formed on said silicide region formed on said gate structure is located in substantially the same location as the disposable structure with substantially the same thickness as the disposable structure.

2. The method of claim 1 wherein said disposable structure is a silicon nitride layer.

3. The method of claim 1 wherein said deposited layer of metal is a layer of titanium.

4. The method of claim 1 wherein said electrically conductive regions are formed from $CVD\text{-}WSi_x$.

5. The method of claim 4 wherein the value of x is between 2.0 and 3.0.

* * * * *